(12) United States Patent
Röhrer et al.

(10) Patent No.: US 7,863,170 B2
(45) Date of Patent: Jan. 4, 2011

(54) SEMICONDUCTOR BODY COMPRISING A TRANSISTOR STRUCTURE AND METHOD FOR PRODUCING A TRANSISTOR STRUCTURE

(75) Inventors: Georg Röhrer, Graz (AT); Bernard Löffler, Gleisdorf (AT); Jochen Kraft, Oberaich (AT)

(73) Assignee: Austriamicrosystems AG, Unterpremstätten (AT)

( * ) Notice: Subject to any disclaimer, the term of this patent is extended or adjusted under 35 U.S.C. 154(b) by 492 days.

(21) Appl. No.: 11/687,187

(22) Filed: Mar. 16, 2007

(65) Prior Publication Data

US 2007/0224748 A1 Sep. 27, 2007

(30) Foreign Application Priority Data

Mar. 17, 2006 (DE) ................ 10 2006 012 447

(51) Int. Cl.
*H01L 21/425* (2006.01)

(52) U.S. Cl. ............... 438/526; 438/289; 438/545; 438/546; 438/370; 438/377; 257/E21.135

(58) Field of Classification Search ........... 438/289, 438/370, 377, 526, 545, 546; 257/E21.135
See application file for complete search history.

(56) References Cited

U.S. PATENT DOCUMENTS

| | | | |
|---|---|---|---|
| 5,021,851 A | | 6/1991 | Haken et al. |
| 5,087,954 A | | 2/1992 | Shirai |
| 5,624,858 A | * | 4/1997 | Terashima ........... 438/419 |
| 5,966,599 A | * | 10/1999 | Walker et al. .......... 438/228 |
| 6,010,926 A | * | 1/2000 | Rho et al. ............ 438/199 |
| 6,724,066 B2 | | 4/2004 | Swanson et al. |
| 6,806,555 B2 | | 10/2004 | Huber et al. |
| 2004/0000694 A1 | | 1/2004 | Johnson |
| 2004/0188712 A1 | | 9/2004 | Lee et al. |

FOREIGN PATENT DOCUMENTS

| | | |
|---|---|---|
| DE | 19646148 A1 | 9/1996 |
| DE | 10044838 A1 | 9/2000 |

OTHER PUBLICATIONS

Examination Report from corresponding German Application 10 2006 012 447.2, dated Nov. 22, 2006.
Examination Report in German Application No. 10 2006 012 447.2-33, dated Sep. 11, 2008.
Examination Report in German Application No. 10 2006 012 447.2-33, dated Feb. 17, 2010.

\* cited by examiner

*Primary Examiner*—Zandra Smith
*Assistant Examiner*—Christy L Novacek
(74) *Attorney, Agent, or Firm*—Fish & Richardson P.C.

(57) ABSTRACT

A semiconductor body includes a substrate, a buried zone having a first conductivity type that is formed in the substrate, a first zone having the first conductivity type that is above the buried zone, a second zone having a second conductivity type that is different from the first conductivity type and above the first zone, and a third zone having the first conductivity type that is above the second zone. The buried zone includes first and second implantation regions that are formed via first and second implantations that are performed using a mask. The buried zone, the first zone, the second zone and the third zone are parts of a first transistor structure.

27 Claims, 7 Drawing Sheets

SEMICONDUCTOR BODY COMPRISING A TRANSISTOR STRUCTURE AND METHOD FOR PRODUCING A TRANSISTOR STRUCTURE

CLAIM TO PRIORITY

This patent application claims priority to German patent application no. 102006012447.2, which was filed on Mar. 17, 2006. The contents of German patent application no. 102006012447.2 are incorporated by reference into this patent application as if set forth herein in full.

TECHNICAL FIELD

This patent application relates to a semiconductor body comprising a transistor structure, a use of a semiconductor body and a method for producing a transistor structure.

BACKGROUND

The most common transistor structures integrated in a semiconductor body are metal oxide semiconductor field effect transistors, abbreviated to MOSETs, and bipolar transistors. A bipolar transistor comprises a collector, a base and an emitter. A collector-base diode is generally operated in the reverse direction and has a breakdown voltage. The latter may depend on a loping concentration and an extension of a doped region of the diode. A permissible operating voltage range depends on the breakdown voltage.

SUMMARY

In accordance with one embodiment, a semiconductor body comprising a transistor structure comprises a substrate having a buried zone having a first conduction type and a first zone having the first conduction type, said first zone being arranged on the buried zone. A second zone having a second conduction type, which is opposite to the first conduction type, is arranged above the first zone. A third zone having the first conduction type is arranged above the second zone.

The buried zone is produced via a first and a second implantation step, in which at least one first dopant is implanted into the substrate. The first, the second and the third zone are deposited onto the buried zone in the substrate. The buried zone, the first zone and the third zone have the same conductive type. The second zone comprises an opposite conduction type. Upon application of a correspondingly polarized voltage between the buried zone and the second zone, a breakdown can occur, which depends, inter alia, on the distance between the buried zone and the second zone and a doping concentration of the first zone. The doping of the first zone is in turn dependent of the first dopant, which diffuses form the buried zone into the first zone during a heat treatment after or during the deposition of the first zone.

A high doping of the buried zone and hence a readily conductive buried zone can be obtained via double implantation. Moreover, via the implantation steps proposed, it is possible to set a doping profile in the first zone and hence a breakdown voltage between the second zone and the buried zone. One advantage of the semiconductor body comprising the transistor structure and the a method for producing the transistor structure includes enabling greater flexibility in the setting of the breakdown voltage.

The breakdown voltage is of importance for operation of a diode formed via the second zone and the buried zone in the reverse direction. The breakdown voltage increases as the doping concentration decreases, since, for the same applied voltage, a depletion zone at a pn junction is wider and the electric field strength decreases as a result. The extension between the second zone and the buried zone is advantageously greater than the widened depletion zone.

In one embodiment, the second implantation step follows the first implantation step.

The transistor structure may be formed as a bipolar transistor. The buried zone and the first zone serve together as a collector layer. A collector terminal is connected to the buried zone. The second zone is used as a base layer, the second zone being connected to a base terminal. The third zone serves as an emitter layer and is connected to an emitter terminal. A base-collector breakdown voltage is set via the two implantation steps. The first, the second and the third zone may in each case be formed as a layer. The buried zone, the first, the second and the third zone may be arranged as a layer stack and be formed essentially in planar fashion.

In an alternative embodiment, the transistor structure is realized as a field effect transistor. The buried zone and the first zone serve together as a drain zone. A drain terminal is connected to the buried zone. A gate electrode is provided on a gate insulator situated above a channel region. The second zone comprises the channel region. The third zone serves as a source zone. A source terminal is connected to the third zone. As source-drain breakdown voltage is set via the two implantation steps. The second zone may be formed as a region, wherein a plurality of areas which bound the region adjoin the first zone. The third zone may likewise be formed as a region, wherein a plurality of areas which bound the region adjoin the second zone.

The buried zone and the first zone comprise a doping profile which is set via the first and the second implantation step. The doping profile in the first zone is furthermore influenced by a dopant concentration which is set during the deposition of the first zone via the deposition process.

In on embodiment, a dopant having a low diffusion constant is used in one of the two implantation steps and a dopant having a high diffusion constant is used in the further one of the two implantation steps, with the result that, in an advantageous manner, the doping profile of the first zone can be set primarily via implantation of the dopant having the high diffusion constant and the doping profile of the buried zone can be set primarily via implantation of the dopant having the low diffusion constant. Consequently, in one embodiment, an implantation step via which implantation into the first zone is performed after the deposition of the first zone can advantageously be omitted.

In one development, the semiconductor body comprises a further transistor structure comprising a further buried zone realized in the substrate. The further transistor structure furthermore comprises a further first zone arranged on the further buried zone, a further second zone realized above the further first zone, and a further third zone realized above the further second zone. The further buried zone is produced via one of the two implantation steps. The further buried zone, the further first and the further third zone have the first conduction type and the further second zone has the second conduction type.

The further buried zone and the further first zone of the further transistor structure exhibit a further doping profile, which differs form the doping profile of the transistor structure. Since the transistor structure is realized via the first and the second implantation steps and the further transistor structure is realized via one of the two implantation steps, in an advantageous manner a doping concentration of the first zone of the further transistor structure may have lower values and, consequently, it is possible to increase the breakdown voltage between the further second zone and the further buried zone of the further transistor structure. In an advantageous manner, only one deposition step is efficient for producing the first zone and the further zone.

In one embodiment, the transistor structure has a value for the breakdown voltage which differs from a value of the breakdown voltage of the further transistor structure. The value of the breakdown voltage of the further transistor structure may be higher than the value of the breakdown voltage of the transistor structure.

The further transistor structure is arranged laterally with respect to the transistor structure. The further transistor structure may be formed as a bipolar transistor or as a MOSFET.

In an ion implantation apparatus, an ion bombardment is performed onto that part of the surface which is oriented in the direction of the ion bombardment. A mask is used for the first and the second implantation step. The mask is therefore not altered between the two implantation steps. The mask for the first implantation step remains on the semiconductor body for the second implantation step. The mask may be realized as a hard mask. The hard mask may have a silicon nitride or polysilicon layer. The hard mask may comprise a silicon oxide layer. As an alternative, the mask is formed as a photoresist mask.

A difference between the doping profile of the further transistor structure and the doping profile of the transistor structure can be achieved via a mask which is formed differently in the region of the further transistor structure than in the region of the transistor structure and decelerates dopant ions in the region of the further transistor structure such that they do not pass into the substrate.

In a first embodiment, the mask in the region of the transistor structure is transmissive and in the region of the further transistor structure is nontransmissive for the ion bombardment during the first and the second implantation step. What can therefore be achieved is that directly after carrying out the first and the second implantation step, the further transistor structure has no buried zone. Through subsequent thermal steps, such as, for example, a heat treatment or an oxidation, a further buried zone of the further transistor structure can be produced by virtue of the fact that dopants diffuse form the buried zone of the transistor structure into the region of the further transistor structure. Since, for this reason, the doping of the buried zone and of the first zone is lower in the region of the further transistor structure than in the region of the transistor structure, the breakdown voltage of the further transistor structure advantageously has a higher value than the breakdown voltage of the transistor structure.

In an alternative embodiment, the mask in the region of the transistor structure is likewise, as above, transmissive for the ion bombardment in the first and second implantation steps. However, the mask in the region of the further transistor structure is transmissive for the ion bombardment in one of the two implantation steps and also nontransmissive for the ion bombardment in the further one of the two implantation steps. As an alternative, the mask in the region of the further transistor structure may be at least partly transmissive for the ion bombardment of one of the two implantation steps and also at least partly transmissive for the ion bombardment in the further one of the two implantation steps.

In one development, the mask in the region of a further structure is nontransmissive for the ion bombardment in the first an din the second implantation step. The further structure may comprise a semiconductor component such as a conventional n-channel MOSFET, a conventional p-channel MOSFET, a memory cell, a diode, a photodiode, a resistor, a coil or an arrangement having complementary metal oxide semiconductor transistors, abbreviated to CMOS transistors.

In one embodiment, a first dopant may be used in the first implantation step and in the second implantation step. The energy of the first dopant during the first implantations step may be different than the energy during the second implantation step. The dose of the first dopant during the first implantation step may be different than the dose during the second implantation step.

In another embodiment, a first dopant is used in the first implantation step and a second dopant issued in the second implantation step, the first dopant and the second dopant having different diffusion constants at a temperature of a heat treatment of an oxidation step which is carried out after the implantation steps.

In an alternative embodiment, a first dopant is used in the first implantation step and a second dopant issued in the second implantation step, in which case, via the first dopant, it is possible to establish a different conduction type in a semiconductor region compared with the second dopant. A lower net dopant concentration can be set by the counterdoping. The lower net dopant concentration is achieved by partly compensating the effect of one of the two dopants by the effect of the other of the two dopants.

The semiconductor body may have silicon as material for the substrate. A dopant for an n conduction type may be phosphorus, arsenic and antimony. A dopant for a p conduction type may be boron.

The semiconductor body may be used in an integrated circuit. The semiconductor may be usable in an integrated circuit designed for a high-voltage application. A high-voltage application is understood to mean an application at voltage higher than an operating voltage of the transistor structure with the lower breakdown voltage. The high voltage may be understood to mean a voltage starting from a lower limit of between 3 volts and 20 volts.

In accordance with one embodiment, a method for producing a transistor structure provides the following steps: a semiconductor body is provided, having a substrate. A first implantation step and a second implantation step are carried out. The first and the second implantation step are provided for producing a buried zone. A first semiconducting zone is deposited on the substrate. A heat treatment is carried out in order to diffuse dopants into the first zone. A second semiconducting zone is formed. A third semiconducting zone is formed above that. The dopants provided for diffusion into the first zone are introduced into the semiconductor body via at least one of the two implantation steps.

A doping profile of the buried zone and of the first zone can thus be set in an advantageous manner via the first and the second implantation step and the heat treatment.

The heat treatment can be performed without oxidation simultaneously taking place. As an alternative, the heat treatment may be carried out as an oxidation method for converting part of the first zone into an oxide. The heat treatment may also be referred to as a heat treatment step.

In one embodiment, a mask is used for the first implantation step and likewise for the second implantation step. In an advantageous manner, an outlay for producing the transistor structure can therefore be kept low. It is thus possible for an undesirable offset between the regions into which implantation is effected via the first implantation step and the regions into which implantation is effected via the second implantation step to be kept small since only one mask is used for both implantation steps rather than a respective mask being used for each of the two implantation steps.

In one embodiment, the method is used for producing the transistor structure as a bipolar transistor. In an alternative embodiment, the method is used for producing the transistor structure as a field effect transistor.

Embodiments are explained in more detail below with reference to the figures. Zones and structures that are identical in respect of their function or effect bear identical reference symbols. In so far as zones or structures correspond to one another in terms of their function, the description thereof is not repeated in each of the following figures.

DETAILED DESCRIPTION

Figure 1A:
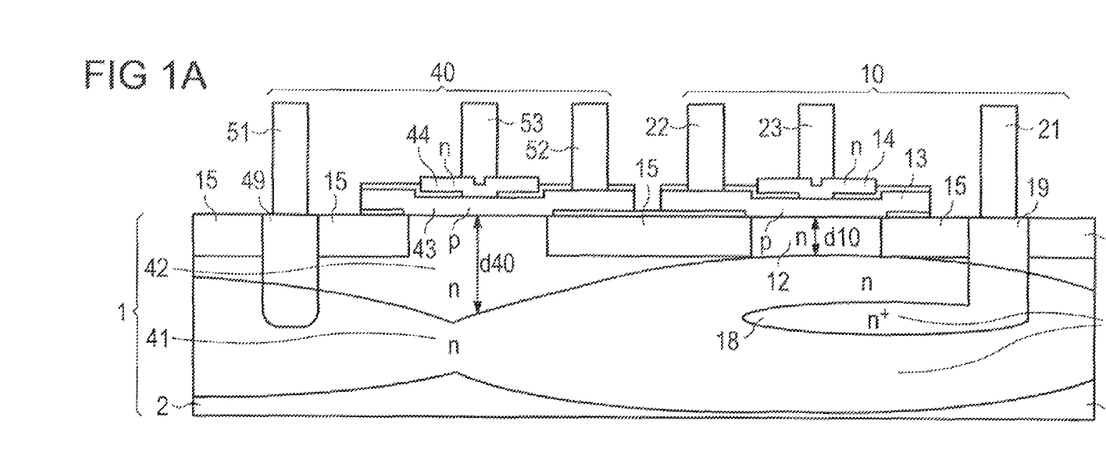
FIGS. 1A and 1B show exemplary embodiments of a semiconductor body with two transistor structures according to the principle proposed.
Figure 1B:
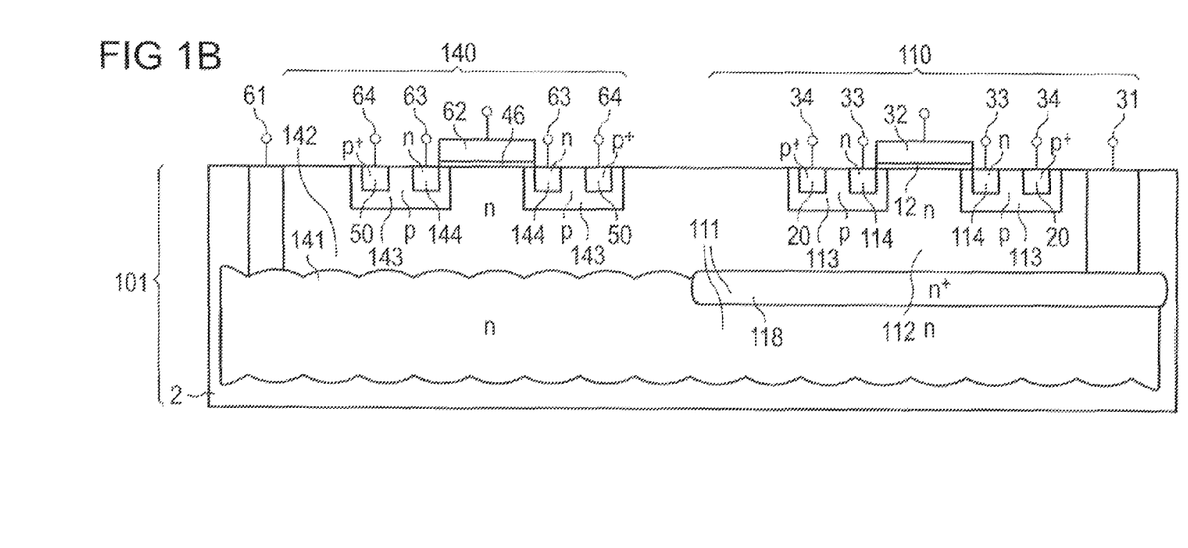

FIGS. 1A and 1B show exemplary embodiments of a semiconductor body 1 with a transistor structure 10 and a further transistor structure 40 according to the principle proposed. FIG. 1A shows two bipolar transistors. The semiconductor body 1 has a substrate 2, above which a buried zone 11 is arranged in the region of the transistor structure 10 and a further buried zone 41 is arranged in the region of the further transistor structure 40. An extension d40 of the buried zone 11 perpendicular to a main surface of the semiconductor body 1 is greater than an extension d40 of the further buried zone 41. The buried zone 11 has a highly doped region 18. The highly doped region 18 of the transistor structure 10 is contacted by a sinker 19. In a corresponding manner, the further buried zone 41 is contacted by a further sinker 49. The first zone 12 is arranged above the buried zone 11 of the transistor structure 10. Arranged above the first zone 12 are a second zone 13 and above that again a third zone 14. The third zone 14 is contacted via an emitter terminal 23, the second zone 13 is contacted by a base terminal 22 and the sinker 19 is contacted by a collector terminal 21.

In the region of the further transistor structure 40, a further first zone 42 is arranged above the further buried zone 41. Arranged above the further first zone 42 is a further second zone 43 and above that in turn a further third zone 44. The further third zone 44 is contacted by a further emitter terminal 53, the further second zone 43 is contacted by a further base terminal 52 and the further sinker 49 is contacted by a further collector terminal 51. An insulation oxide 15 is arranged on parts of the first zone 12 and parts of the further first zone 42.

A collector of the transistor structure 10 is advantageously contacted by a highly doped region 18 because the transistor structure 10 thereby has short switching times and, consequently, a high limiting frequency. The extension d40 of the further first zone 42 perpendicular to the main surface of the semiconductor body 1 is advantageously greater than the extension d10 of the first zone 12, with the result that a collector-base breakdown voltage of the further transistor structure 40 has a higher value than a collector-base breakdown voltage of the transistor structure 10. In an advantageous manner, bother fast bipolar transistors 10 and bipolar transistors 40 having high breakdown voltages arranged laterally alongside one another can be realized via a production method on the semiconductor body 1.

FIG. 1B shows a transistor structure 110 and a further transistor structure 140, which are in each case formed as a field effect transistor. Both transistor structure 110, 140 are arranged on the substrate 2 of a semiconductor body 101. Above the substrate 2, a buried zone 111 comprising a highly doped region 118 is arranged in the region of the transistor structure 110, and a further buried zone 141 is arranged in the region of the further transistor structure 140. In the region of the transistor structure 110, a first zone 112 is situated above the buried zone 111, two regions of a second zone 113 being diffused into said first zone. A region of a third zone 114 and a highly doped region 20 are in each case arranged within the two regions of the second zone 113. Between the two regions of the third zone 114, there is arranged at the surface of the first and of the second zone 112, 113 a gate insulator 16 and above that a gate electrode 32. The two regions of the third zone 114 are contacted by a source terminal 33, the two highly doped regions 20 are contacted by a terminal 34 and the highly doped region 118 is contacted by a drain terminal 31.

The further transistor structure 140 has a further first zone 142 above a further buried zone 141, two regions of a further second zone 143 being diffused into said further first zone. The two regions of the further second zone 143 in each case have a region of a further third zone 144 and a highly doped region 50. Between the two regions of the further third zone 144, there is arranged on the surface a further gate insulator 46 and above that a further gate electrode 62. The further buried zone 141 is contacted by a further drain terminal 61, the two regions of the further third zone 144 are contacted by a further source terminal 63 and the two highly doped regions 50 are contacted by a further terminal 64.

A current flows in the transistor structure 110 from the source terminal 33 via an inversion layer, which forms at the interface of the two regions of the second zone 113 with respect to the gate insulator 16, to the first zone 112 and from the first zone 112 via the highly doped region 118 of the buried zone 11 to the drain terminal 31. The inversion layer forms in a manner dependent on a voltage at the gate electrode 32. Consequently, the current flowing between the source terminal 33 and the drain terminal 31 is set by the voltage at the gate electrode 32. A breakdown voltage between the source terminal 33 and the drain terminal 31 depends, inter alia, on a doping profile in the first zone 112 and the extension of the first zone 112.

In a corresponding manner, a further current flows in the further transistor structure 140 between the further source terminal 63 and the further drain terminal 61 and is controlled by a voltage at the further gate electrode 62. A breakdown voltage between the further source terminal 63 and the further drain terminal 61 depends, inter alia, on a doping profile in the further first zone 142 and the extension of the further first zone 142 and differs from the breakdown voltage between the source terminal 33 and the drain terminal 31.

Figure 2A:
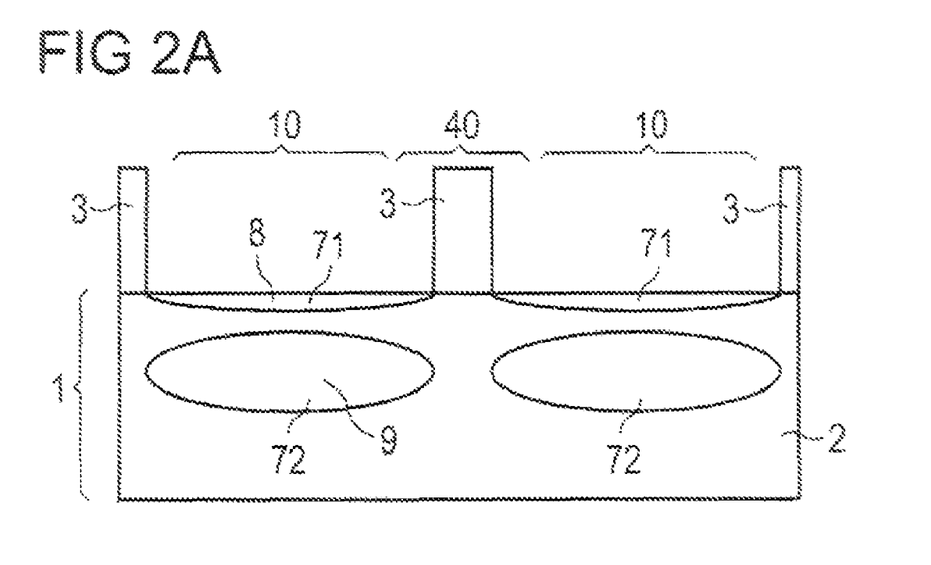
FIGS. 2A and 2B show exemplary embodiments of a semiconductor body with a buried zone before and after a heat treatment according to the principle proposed.
Figure 2B:
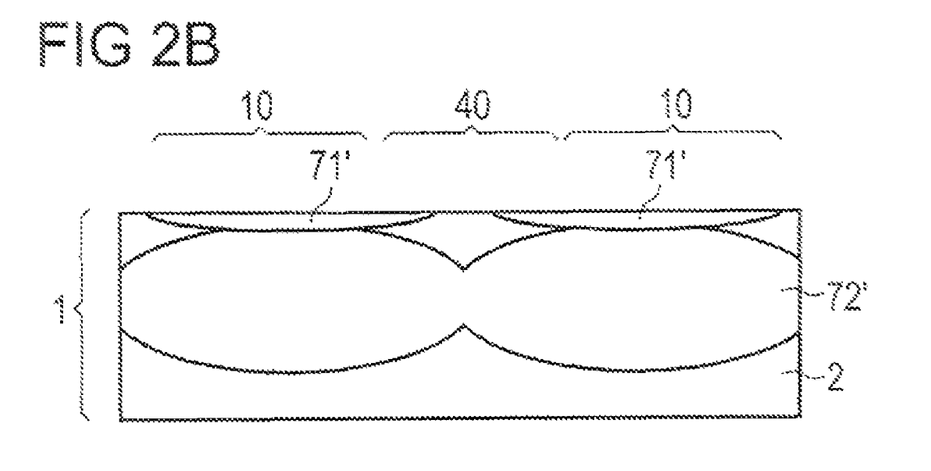

FIGS. 2A and 2B show exemplary embodiments of a semiconductor body 1 with a buried zone before and after a heat treatment according to the principle proposed. FIG. 2A shows the semiconductor body 1 having the substrate 2. The transistor structure 10 is realized in two regions and the further transistor structure 40 is realized in one region. A mask 3 is provided in the region of the further transistor structure 40, which mask prevents dopants from being implanted in the region below the mask 3 during a first and a second implantation step I1, I2. FIG. 2A shows the substrate 2 with a first implantation region 71, which is situated at the surface of the semiconductor body 1 and is produced via a first implantation step I1 with a first dopant 8, and with a second implantation region 72, which is at a distance from the surface of the semiconductor body 1 and is realized by a second implantation step I2 with a second dopant 9.

FIG. 2B shows the semiconductor body 1 in accordance with FIG. 2A after removal of the mask 3 and after a heat treatment. Since the first dopant 8 is chosen such that is has a lower diffusion constant compared with the second dopant 9 during a heat treatment, the first implantation region 71' in FIG. 2B is only slightly enlarged relative to the illustration if FIG. 2A. By contrast, the second implantation region 72' in FIG. 2B is significantly enlarged compared with the second implantation region 72 in accordance with FIG. 2A. As a result of the lateral diffusion of the second dopant 9 of the second implantation regions 72, the two second implantation regions 72' touch one another in the region of the further transistor structure 40.

The transistor structure 10 and the further transistor structure 40 are completed via the subsequent process steps. The first implantation region 71' and the second implantation region 72' contribute to the buried zone 11 of the transistor structure 10. The second implantation region 72' contributes to the further buried zone 41 of the further transistor structure 40.

Figure 3A:
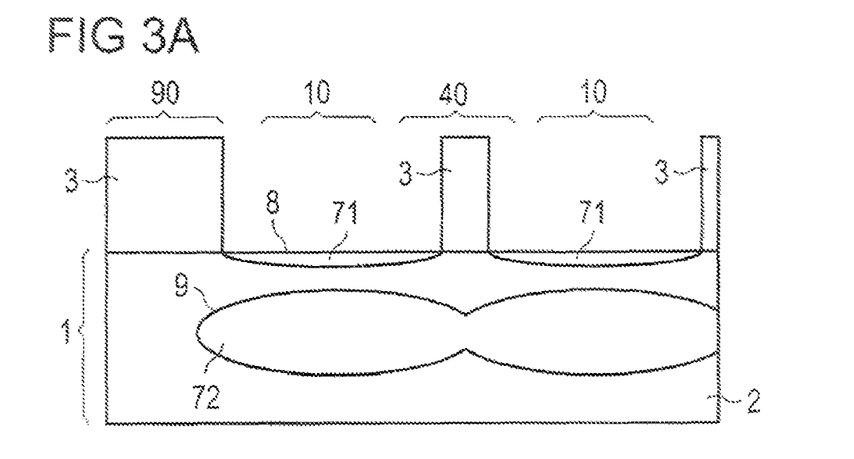
FIGS. 3A and 3C show alternative exemplary embodiments of a semiconductor body according to the principle proposed.
Figure 3B:
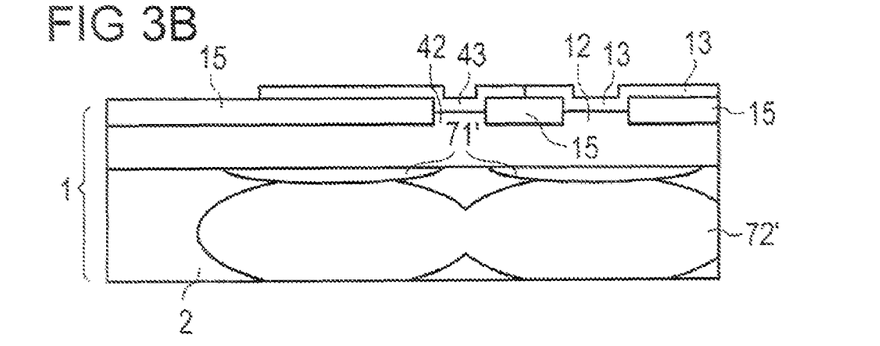
Figure 3C:
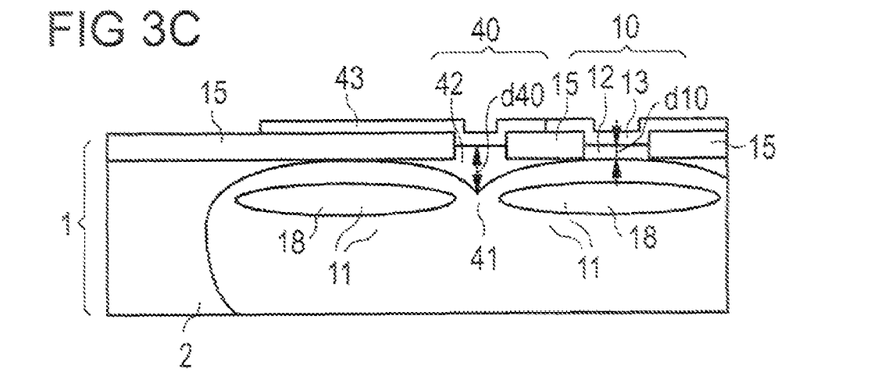

FIGS. 3A to 3C show alternative exemplary embodiments of a semiconductor body 1 according to the principal proposed, with a mask 3. FIG. 3A shows two regions of the semiconductor body 1 with the transistor structure 10, between which the further transistor structure 40 is arranged, and a region with a further structure 90. The mask 3 is formed in a part of the further transistor structure 40 and in the region of the further structure 90. Through the first implantation step I1, the first implantation region 71 is implanted at the locations at which the substrate 2 is not covered by the mask 3. The second implantation region 72 is realized via the second implantation step. The second implantation step I2 is performed with an implantation during which the ion bombardment does not impinge perpendicularly on the main surface of the semiconductor body 1. On account of the fact that a second dopant 9 does not impinge perpendicularly on the main surface of the semiconductor body 1 in the second implantation step, dopants 9 are also implanted into the substrate 2 below the mask 3 in the region of the further transistor structure 40. The second implantation region 72 is therefore already arranged both below the transistor structure 40 prior to a heat treatment. The distance between the second implantation regions 72 and the main surface in the region of the further transistor structure 40 is advantageously greater than the distance between the second implantation region 72 and the main surface in the region of the transistor structure 10.

FIG. 3B shows the semiconductor body 1 in accordance with FIG. 3A after the deposition of the first zone 12 and of the further first zone 42, which is performed in one step. The thickness of the first zone 12 and the thickness of the further first zone 42 are therefore approximately identical directly after the deposition in the epitaxy reactor. An insulation oxide 15 and a second zone 13, and a further second zone 43 are deposited above the first zone 12 and the further first zone 42, respectively. The overlying zones and layers that follow are not illustrated for reasons of clarity.

The deposition of the first zone 12 and of the further first zone 42 may be performed via an epitaxy reactor.

FIG. 3C shows the semiconductor body 1 from FIG. 3B after carrying out a heat treatment. On account of the heat treatment, the first implantation region 71 has extended into the overlying layer. On account of the high diffusion constant of the second dopant 9, the second implantation region 72' extends to a greater degree, with the result that the first zone 12 and the further first zone 42 in accordance with FIG. 3C have smaller extensions than directly after the deposition operation in FIG. 3B. The extension d10 of the first zone 12 of the transistor structure 10 is significantly smaller than the extension d40 of the further first zone 42 of the further transistor structure 40. In the region of the further structure 90, the substrate 2 is not influenced by the two implantation steps. A further semiconductor component, which does not require a buried layer 11, can be realized there.

Figure 4A:
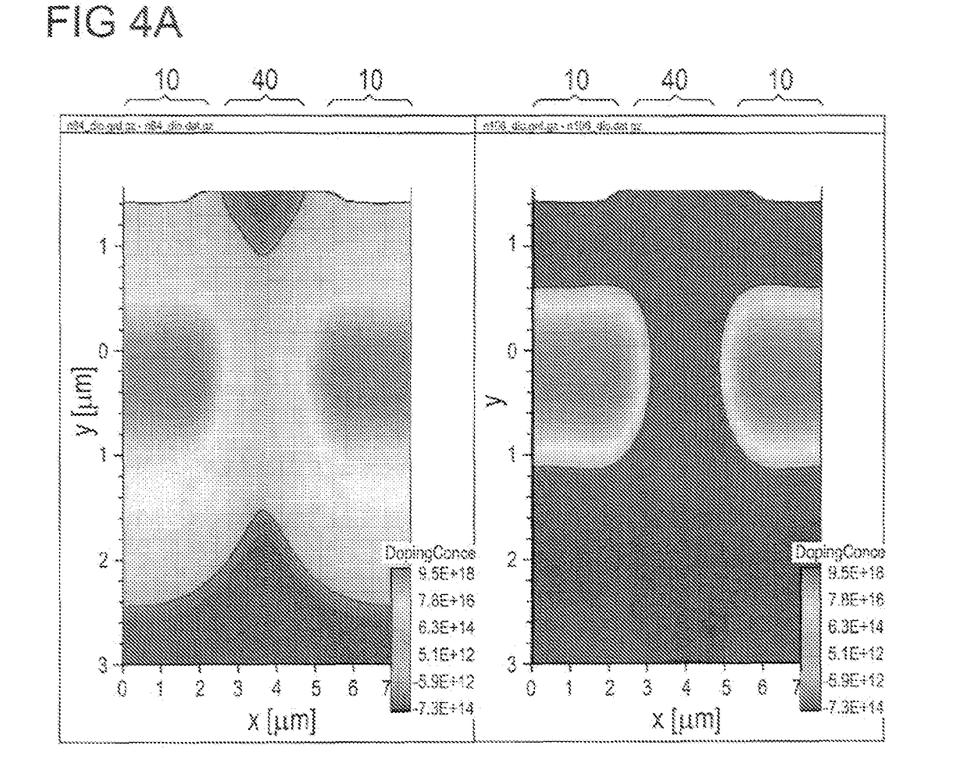
FIGS. 4A and 4B show exemplary doping profiles.
Figure 4B:
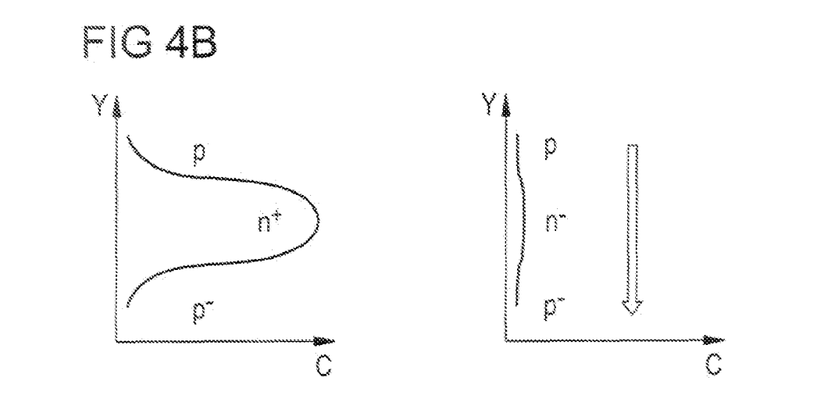

FIGS. 4A and 4B show exemplary doping profiles. FIG. 4A shows on the left a simulated doping profile of an arrangement in accordance with FIG. 3C, while a doping profile of an arrangement in which, in contrast to FIGS. 3A to 3C, a second implantation step was not carried out is shown on the right. The depth is designated by y and the lateral dimension is designated by x. In an advantageous manner, in accordance with FIG. 4A on the left dopants which were implanted in the region of the transistor structure 10 by the second implantation step I2 diffuse into the region of the further transistor structure 40 and form the buried zone 41 there.

FIG. 4B schematically shows a doping concentration C as a function of the depth Y. The doping concentration C illustrated on the left in the center of the illustration in FIG. 4A is shown on the left in FIG. 4B, and the doping concentration C illustrated on the right in the center of the illustration in FIG. 4A is shown on the right in FIG. 4B. The doping concentration in the weakly n-doped region in FIG. 4B on the right is so slight that a breakdown—indicated by an arrow—between the two p-doped zones is possible at a low breakdown voltage. This is avoided by the doping profile illustrated on the left in FIG. 4B.

Figure 5A:
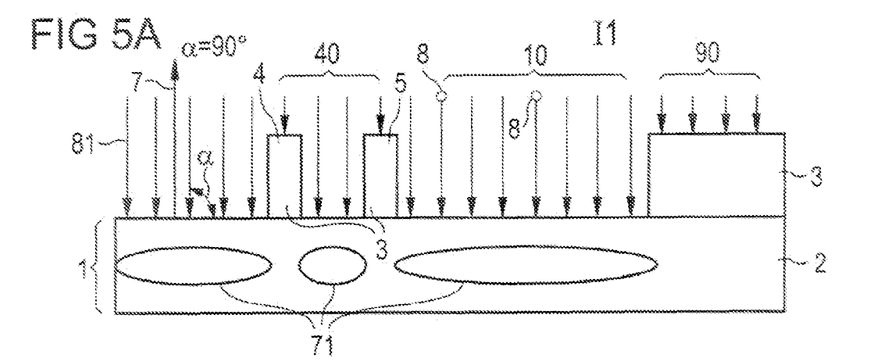
FIGS. 5A and 5E show alternative exemplary embodiments of a semiconductor body with a mask having two ridges according to the principal proposed.

FIGS. 5A to 5E show alternative exemplary embodiments of a semiconductor body 1 with mask 3 having two ridges 4, 5 according to the principle proposed. FIG. 5A shows the semiconductor body 1 with the mask 3 during the first implantation step I1. In this case, the ion bombardment 81 is performed approximately perpendicularly to the first main surface of the semiconductor body 1, with the result that a first angle α between the ion bombardment 81 and the first main surface is approximately 90 degrees. A normal 7 to the surface is depicted on the first main surface of the semiconductor body 1, and is approximately parallel to the ion bombardment 81. In FIG. 5A, the mask 3 comprises two ridges in the region of the further transistor structure 40. The two ridges 4, 5 prevent an ion implantation directly below the two ridges 4, 5. The mask 3 in the region of the further structure 90 is furthermore formed in a manner nontransmissive for the ion bombardment. The first implantation region 71 is therefore formed distinctly in the region of the transistor structure 10, is formed to a smaller extent in the region of the further transistor structure 40 and is not formed in the region of the further structure 90.

As an alternative, the first angle α has a value of approximately 83 degrees in order to avoid so-called channeling of the first dopant 8 during the first implantation step I2. As an alternative, more than two ridges 4, 5 are provided.

Figure 5B:
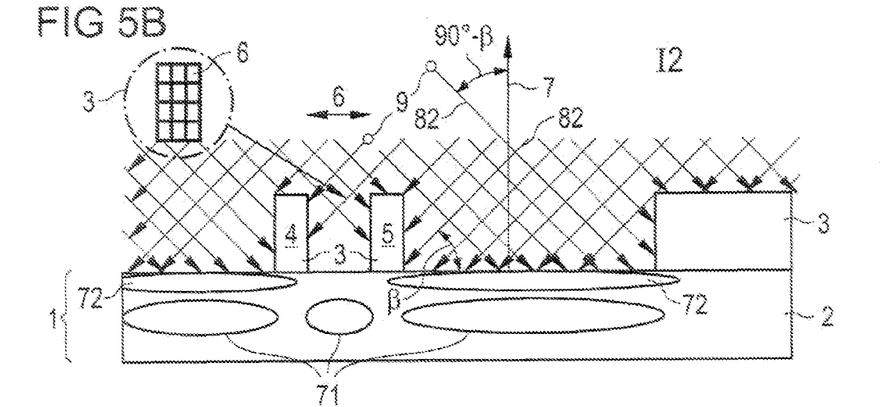

FIG. 5B shows the semiconductor body 1 from FIG. 5A during the second implantation step I2, in which the ion bombardment 82 has a second angle β with respect to the first main surface of the semiconductor body 1. The second angle β is approximately 45 degrees. FIG. 5B depicts the normal 7 to the surface, which forms an angle (90 degrees–β) with the second ion bombardment 82. The ridges 4, 5 of the mask 3 prevent, by a shading effect, the second dopant 9 from reaching the substrate 2 in the region of the further transistor structure 40 during the second implantation process I2. The second dopant 9 is absorbed by the ridges 4, 5. Therefore, the second implantation region 72 is formed primarily in the region of the transistor structure 10 and not in the region of the further transistor structure 40 and of the further structure 90.

The semiconductor body 1 can advantageously be oriented during the second implantation step I2 in such a way that the second ion bombardment 82 is performed approximately perpendicularly to the ridges 4, 5 since an ion bombardment parallel to the ridges 4, 5 would not be subject to the shading effect referred to above.

FIG. 5B shows at the top on the left an exemplary embodiment of the mask 3 which has the ridges 4, 5 and additionally connections between the ridges, thereby forming openings 6 in rectangular form. With a mask 3 formed in this way, the semiconductor body 1 can advantageously rotate about the normal 7 to the surface during the second implantation step I2. As an alternative, the openings 6 may be formed as squares.

Figure 5C:
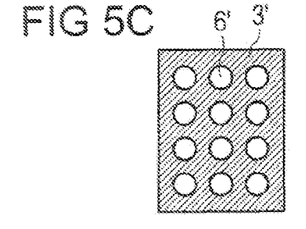
Figure 5D:
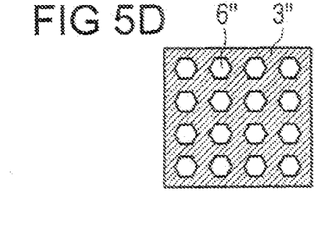

FIGS. 5C and 5D show two further exemplary embodiments of the mask. The mask 3' has circular openings 6' in accordance with FIG. 5C, and the mask 3" has hexagonal openings 6" in accordance with FIG. 5D. The first dopant 8 can be implanted in the substrate 2 through the openings 6' or 6" during the first implantation step I1. By contrast, the second angle β assumed by the ion bombardment 82 with respect to the main surface of the semiconductor body 1 during the second implantation step I2 prevents a formation of the second implantation region 72 in the region of the further transistor structure 40.

Figure 5E:
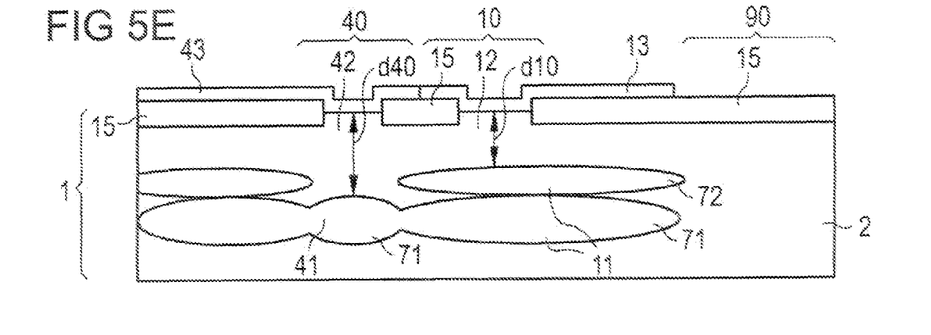

FIG. 5E shows the semiconductor body 1 after carrying out an epitaxy step and after an oxidation. During the oxidation, the second implantation region 72 diffuses slightly into the epitaxial layer and forms the buried zone 11 there. On account of the higher diffusion coefficient of the first dopant 8 compared with the diffusion coefficient of the second dopant 9, during the oxidation process the zones of the first implantation region 71, which are still separate in FIGS. 5A and 5B, are joined by lateral diffusion and form the further buried zone 41 in the region of the further transistor structure 40. The extension d40 of the further transistor structure 40. The extension d40 of the further first zone 42 is significantly greater than the extension d10 of the first zone 12. The substrate 2 was not influenced by the two implantation steps in the region of the further structure 90.

Figure 6A:
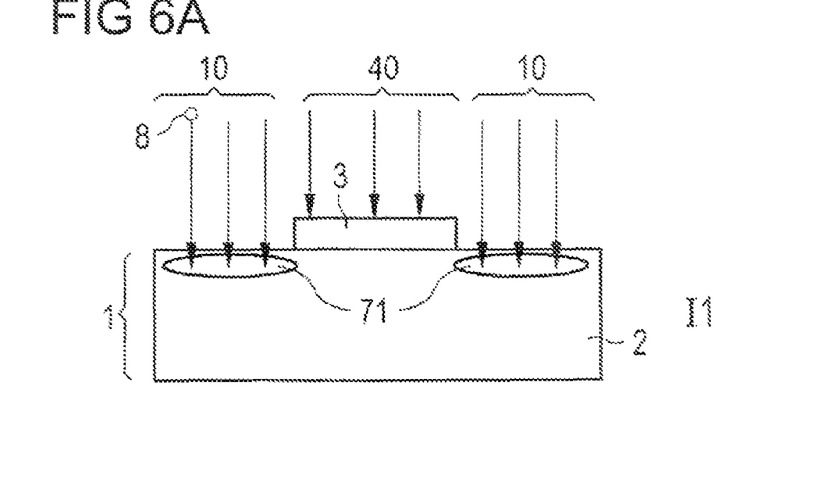
FIGS. 6A and 6C show an alternative exemplary embodiment of a semiconductor body with a thin mask layer according to the principle proposed.
Figure 6B:
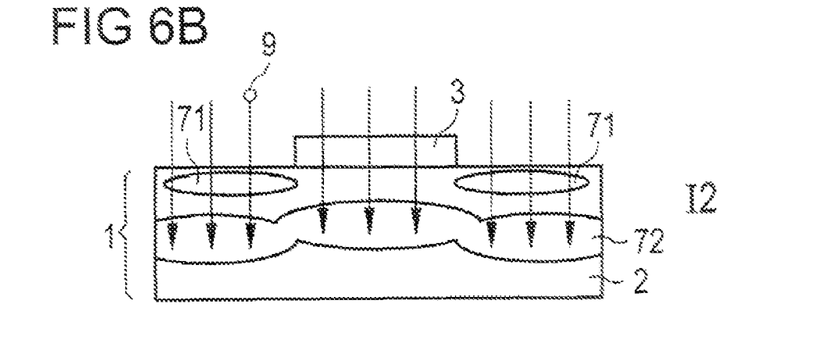
Figure 6C:
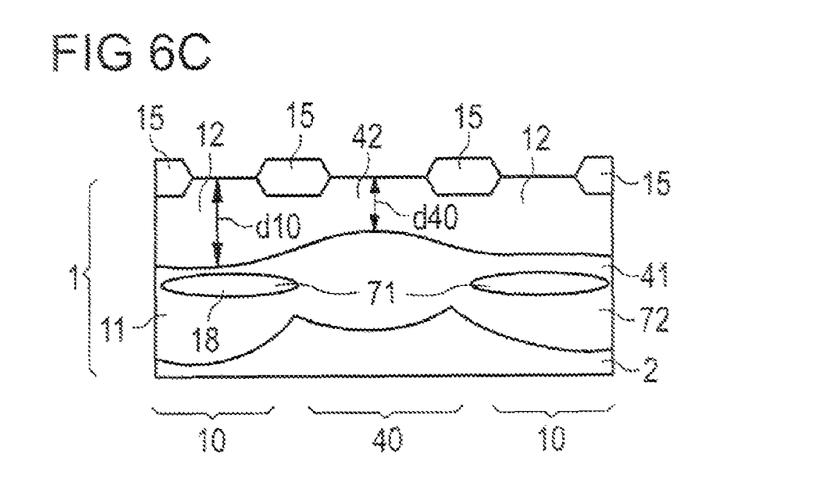

FIGS. 6A and 6C show alternative exemplary embodiment of the semiconductor body 1 according to the principle proposed. The mask 3 is realized as a thin layer in the region of the further transistor structure 40. FIG. 6A shows a first implantation step I1, during which a first dopant 8 is implanted with a low implantation energy, with the result that the first dopant 8 forms first implantation regions 71 in the region of the transistor structure 10. In the region of the further transistor structure 40, the mask 3 absorbs the dopant ions 8.

FIG. 6B shows a further implantation step I2, during which a second dopant 9 is implanted with a higher energy, with the result that a second implantation region 72 is formed both in the region of the further transistor structure 40 and in the region of the transistor structure 10.

FIG. 6C shows the semiconductor body after a heat treatment and an oxidation step, as a result of which the first implantation region 71 and the second implantation region 72 merge with one another in the region of the transistor structure 10. An extension d10 of the first zone 12 perpendicular to the main surface of the semiconductor body 1 is greater in the region of the transistor structure 10 than an extension d40 of the further first zone 42 in the region of the further transistor structure 40. Depending on the thickness of the mask, the two dopants 8, 9 and the two implantation energies, in an advantageous manner in the case of the first implantation step I1 a significantly higher proportion of dopants remains in the mask 3 and a significantly lower proportion thus passes into the semiconductor body 1 than in the case of the second implantation step I2. Consequently, the transistor structure 10 advantageously has a higher breakdown voltage and a lower bulk resistance into the buried zone 12 compared with the further transistor structure 40.

Figure 7A:
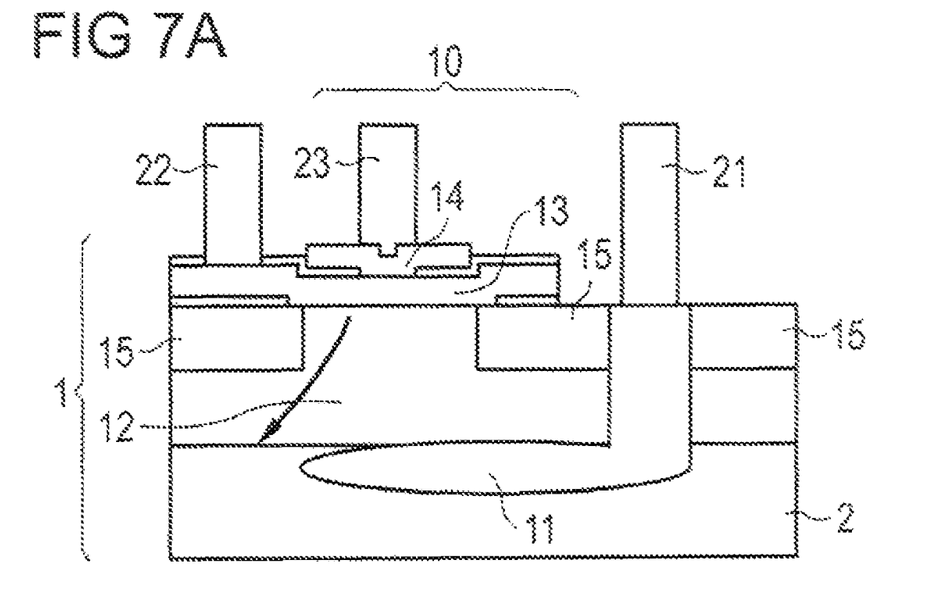
FIGS. 7A and 7B show exemplary embodiments of a transistor structure with a stopping region according to the principle proposed and without a stopping region.

FIG. 7A shows an exemplary embodiment of a transistor structure 10 without a stopping region, formed as a bipolar transistor. The semiconductor body 1 comprises the substrate 2 with a buried zone 11. The first zone 12, the second zone 13 and the third zone 14 are arranged above the buried zone 11. Since the first zone 12 is only lightly doped, a breakdown can occur from the second zone 13 to the substrate 2. A possible breakdown path is indicated by an arrow.

Figure 7B:
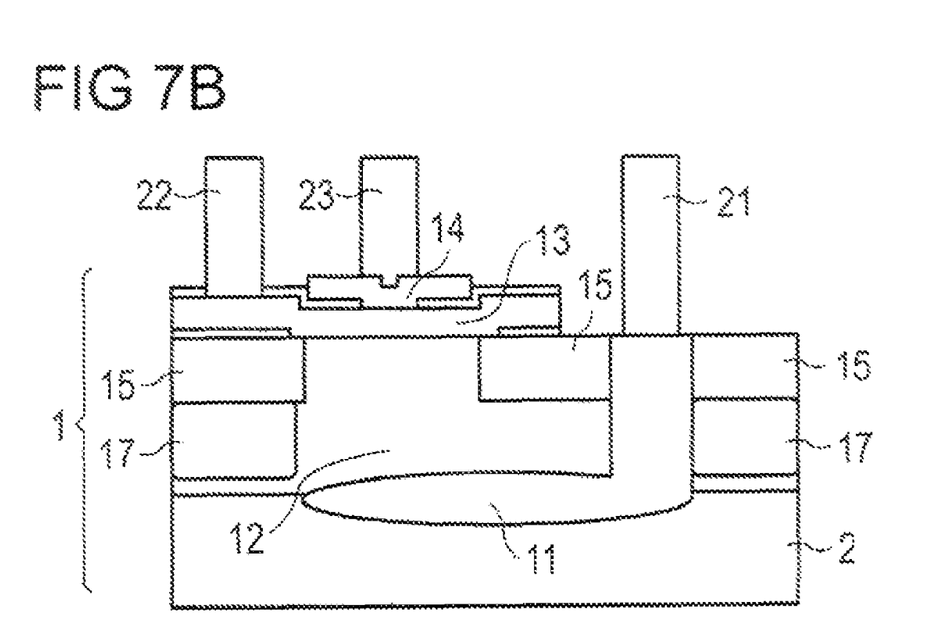

FIG. 7B shows an exemplary embodiment of a transistor structure 10, formed as a bipolar transistor, with a stopping region 17 according to the principle proposed. In addition to the illustration if FIG. 7A, the semiconductor body 1 in accordance with FIG. 7B has a stopping region 17 arranged between the insulation oxide 15 and the buried zone 11. The stopping region 17 can be realized by implantation into the first zone 12 after the deposition of the first zone 12. The stopping region 17 is of the same conductor type as the buried zone 11. Consequently, it is advantageously possible to prevent a lateral breakdown from the second zone 13 to the substrate 2.

What is claimed is:

1. A method for producing at least one transistor structure using a semiconductor body comprising a substrate, the method comprising:

performing a first implantation in the substrate;

performing a second implantation in the substrate, wherein the first implantation and the second implantation produce a buried zone, and wherein a mask is used to perform the first implantation and the mask is used to perform the second implantation;

forming, above the buried zone, a first zone comprising a semiconductor layer;

performing a heat treatment to diffuse dopants into the first zone;

forming, above the first zone, a second zone comprising a semiconductor layer; and forming, above the second zone, a third zone comprising a semiconductor layer;

wherein the buried zone, the first zone, and the third zone are of a first conduction type, wherein the second zone is of a second conduction type, and wherein the first conduction type and the second conduction type are opposite conduction types.

2. The method of claim 1, wherein at least part of the heat treatment comprises an oxidation method.

3. The method of claim 1, wherein the mask used to perform the first implantation and the second implantation comprises a mask structure; and further comprising:
depositing a mask layer and patterning the mask layer in order to form the mask structure before the first implantation; and
removing the mask structure after the second implantation.

4. The method of claim 1, further comprising:
implanting a first dopant in the first implantation and in the second implantation.

5. The method of claim 1, further comprising:
implanting a first dopant in the first implantation and a second dopant in the second implantation, the first dopant having a different diffusion constant than the second dopant during the heat treatment.

6. The method of claim 1, further comprising:
implanting a first dopant in the first implantation and a second dopant in the second implantation, the first dopant comprising a different conductivity type than the second dopant.

7. The method of claim 1, wherein the first implantation and the second implantation are performed with different dopant energies.

8. The method of claim 1, further comprising:
implanting a dopant into a stopping region of the first zone so that the stopping region has a same conductivity type as the first zone and so that the stopping region is doped to a concentration that prevents lateral breakdown between the second zone and the substrate during operation of the at least one transistor structure.

9. The method of claim 1, wherein the mask used to perform the first implantation and the second implantation comprises a mask structure; and, further comprising:
forming the mask structure in a region of a first transistor structure differently than in a region of a second transistor structure.

10. The method of claim 9, wherein forming the mask structure comprises:
patterning a mask layer so that
(i) the mask structure is transmissive in the region of the first transistor structure, and
(ii) in the region of the second transistor structure, the mask structure is nontransmissive during ion bombardment in the first implantation and the second implantation.

11. The method of claim 9, wherein forming the mask structure comprises:
patterning a mask layer so that:
(i) in the region of the first transistor structure, the mask structure is transmissive during ion bombardment in the first implantation and the second implantation, and
(ii) in the region of the second transistor structure, the mask structure is
(a) at least partly transmissive during ion bombardment in one of the first implantation and the second implantation, and
(b) at least partly nontransmissive during ion bombardment in a different one of the first implantation and the second implantation.

12. The method of claim 11, wherein the mask layer is patterned so that the mask structure, in the region of the second transistor structure, comprises at least two ridges and an opening between the at least two ridges; and
wherein a first angle of incidence of an ion beam relative to a main surface of the semiconductor body is greater in one implantation than a second angle of incidence of an ion beam relative to the main surface of the semiconductor body in a second implantation.

13. The method of claim 12, wherein the first angle has a value between 80 degrees and 90 degrees inclusive and the second angle has a value between 30 degrees and 60 degrees inclusive.

14. A method for producing at least one transistor structure using a semiconductor body comprising a substrate, the method comprising:
performing a first implantation in the substrate;
performing a second implantation in the substrate, wherein the first implantation and the second implantation produce a buried zone, and wherein a mask is used to perform the first implantation and the mask is used to perform the second implantation;
forming, above the buried zone, a first zone comprising a semiconductor layer;
performing a heat treatment to diffuse dopants into the first zone;
forming, above the first zone, a second zone comprising a semiconductor layer; and
forming, above the second zone, a third zone comprising a semiconductor layer;
wherein the at least one transistor structure comprises a bipolar transistor comprised of a collector layer, a base layer, and an emitter layer, wherein the collector layer comprises the buried zone and the first zone, the base layer comprises the second zone, and the emitter layer comprises the third zone.

15. The method of claim 14, wherein at least part of the heat treatment comprises an oxidation method.

16. The method of claim 14, wherein the mask used to perform the first implantation and the second implantation comprises a mask structure; and further comprising:
depositing a mask layer and patterning the mask layer in order to form the mask structure before the first implantation; and
removing the mask structure after the second implantation.

17. The method of claim 14, further comprising:
implanting a first dopant in the first implantation and in the second implantation.

18. The method of claim 14, further comprising:
implanting a first dopant in the first implantation and a second dopant in the second implantation, the first dopant having a different diffusion constant than the second dopant during the heat treatment.

19. The method of claim 14, further comprising:
implanting a first dopant in the first implantation and a second dopant in the second implantation, the first dopant comprising a different conductivity type than the second dopant.

20. The method of claim 14, wherein the first implantation and the second implantation are performed with different dopant energies.

21. The method of claim 14, further comprising:
implanting a dopant into a stopping region of the first zone so that the stopping region has a same conductivity type as the first zone and so that the stopping region is doped to a concentration that prevents lateral breakdown between the second zone and the substrate during operation of the at least one transistor structure.

22. The method of claim 14, wherein the mask used to perform the first implantation and the second implantation comprises a mask structure; and, further comprising:
forming the mask structure in a region of a first transistor structure differently than in a region of a second transistor structure.

23. The method of claim 22, wherein forming the mask structure comprises:
patterning a mask layer so that
(i) the mask structure is transmissive in the region of the first transistor structure, and
(ii) in the region of the second transistor structure, the mask structure is nontransmissive during ion bombardment in the first implantation and the second implantation.

24. The method of claim 22, wherein forming the mask structure comprises:
patterning a mask layer so that:
(i) in the region of the first transistor structure, the mask structure is transmissive during ion bombardment in the first implantation and the second implantation, and
(ii) in the region of the second transistor structure, the mask structure is
(a) at least partly transmissive during ion bombardment in one of the first implantation and the second implantation, and
(b) at least partly nontransmissive during ion bombardment in a different one of the first implantation and the second implantation.

25. The method of claim 24, wherein the mask layer is patterned so that the mask structure, in the region of the second transistor structure, comprises at least two ridges and an opening between the at least two ridges; and
wherein a first angle of incidence of an ion beam relative to a main surface of the semiconductor body is greater in one implantation than a second angle of incidence of an ion beam relative to the main surface of the semiconductor body in a second implantation.

26. The method of claim 25, wherein the first angle has a value between 80 degrees and 90 degrees inclusive and the second angle has a value between 30 degrees and 60 degrees inclusive.

27. A method for producing at least one transistor structure using a semiconductor body comprising a substrate, the method comprising:
performing a first implantation in the substrate;
performing a second implantation in the substrate, wherein the first implantation and the second implantation produce a buried zone, and wherein a mask is used to perform the first implantation and the mask is used to perform the second implantation;
forming, above the buried zone, a first zone comprising a semiconductor layer;
performing a heat treatment to diffuse dopants into the first zone;
forming, above the first zone, a second zone comprising a semiconductor layer;
forming, above the second zone, a third zone comprising a semiconductor layer;
wherein the mask used to perform the first implantation and the second implantation comprises a mask structure;
wherein the method further comprises forming the mask structure in a region of a first transistor structure differently than in a region of a second transistor structure; and
wherein forming the mask structure comprises:
patterning a mask layer so that:
(i) in the region of the first transistor structure, the mask structure is transmissive during ion bombardment in the first implantation and the second implantation, and
(ii) in the region of the second transistor structure, the mask structure is:
(a) at least partly transmissive during ion bombardment in one of the first implantation and the second implantation, and
(b) at least partly nontransmissive during ion bombardment in a different one of the first implantation and the second implantation.

* * * * *

UNITED STATES PATENT AND TRADEMARK OFFICE
CERTIFICATE OF CORRECTION

| | | |
|---|---|---|
| PATENT NO. | : 7,863,170 B2 | |
| APPLICATION NO. | : 11/687187 | |
| DATED | : January 4, 2011 | |
| INVENTOR(S) | : Georg Rohrer et al. | |

It is certified that error appears in the above-identified patent and that said Letters Patent is hereby corrected as shown below:

Column 1, Line 11;
Insert --hereby-- between "are" and "incorporated"

Signed and Sealed this
Twenty-ninth Day of March, 2011

David J. Kappos
*Director of the United States Patent and Trademark Office*